United States Patent [19]

Lindmayer et al.

[11] 3,888,698

[45] June 10, 1975

[54] INFRARED-TRANSPARENT SOLAR CELL

[75] Inventors: Joseph Lindmayer, Bethesda; Denis John Curtin, Rockville; Joseph Gabriel Haynos; Andrew Meulenberg, Jr., both of Gaithersburg, all of Md.

[73] Assignee: Communications Satellite Corporation, Washington, D.C.

[22] Filed: Nov. 9, 1972

[21] Appl. No.: 305,030

[52] U.S. Cl. .................................................. 136/89
[51] Int. Cl. .......................................... H01m 29/00
[58] Field of Search ....................................... 136/89

[56] References Cited

UNITED STATES PATENTS

| | | | |
|---|---|---|---|
| 2,984,775 | 5/1961 | Matlow | 136/89 X |
| 3,104,188 | 9/1963 | Moncrieff-Yeates | 136/89 |
| 3,376,163 | 4/1968 | Abrahamson | 136/89 |
| 3,411,952 | 11/1968 | Ross | 136/89 |
| 3,533,850 | 10/1970 | Tarneja | 136/89 |
| 3,589,946 | 6/1971 | Tarneja | 136/89 |

*Primary Examiner*—Winston A. Douglas
*Assistant Examiner*—John F. Niebling
*Attorney, Agent, or Firm*—Sughrue, Rothwell, Mion, Zinn and Macpeak

[57] ABSTRACT

A semi-conductor solar cell having a back electrode which allows deep infrared light to pass out of the cell into space. The cell back electrode is formed in a pattern which covers less than 10 percent of the bottom surface of the cell. An insulating material having good optical matching characteristics covers the remainder of the bottom surface.

14 Claims, 4 Drawing Figures

INFRARED-TRANSPARENT SOLAR CELL

BACKGROUND OF THE INVENTION

The present invention is in the field of solid state photovoltaic cells for use in converting solar energy into electrical energy.

In state of the art solar cells, a semiconductor body is provided having a p-n junction as close to the top or light receiving surface as is practical. Silicon is the most widely used material for solar cells but other semiconductor solar cells are also known. Electrodes are attached to the top and bottom surfaces of the semiconductor device to enable connection of the photovoltage created to external circuitry. Optical coatings are also used on the top surface to provide desired optical matching characteristics between the space/optical coating interface and the optical coating/semiconductor interface. The optical coating is selected to maximize passage therethrough of useful wavelength light and to minimize passage therethrough of non-useful wavelength light.

The wavelength of light which will be useful to generate electron/hole pairs and therefore generate a photovoltage depends upon the band gap of the semiconductor material used. As an example, present silicon solar cells are responsive to sunlight in the region of 0.4 to 1.1 microns wavelength. The sun's energy below 0.4 microns and above 1.1 microns is usually either reflected before reaching the cells; e.g., by using ultraviolet filters as the optical coating, or absorbed by the cell back electrode without generating carriers. Typically, the wavelengths absorbed by the back electrode are those having photon energy or wavelength above the maximum useful wavelength, e.g., 1.1 microns for silicon. This deep infrared light serves no useful purpose and raises the equilibrium temperature of the cells. Additionally a significant portion of the current generating photons has more energy than required. This excess energy also adds to the cell temperature.

The front electrode is usually formed in a grid like arrangement to enable light to pass into the top surface of the semiconductor. Competing factors operate in the selection of a proper front electrode pattern. On the one hand it is desirable to have the electrode cover a minimum of the top surface. On the other hand, it is desirable to have a portion of the electrode near every surface point thereby reducing the lateral distance an electron must travel and enabling one to place the p-n junction very near the surface. It should be noted that a p-n junction near the surface is an advantage from the standpoint of useable electron/hole pairs created but is a disadvantage from the standpoint of increased lateral resistance to electron movement. A preferred pattern for the front electrode is described in a copending application of Lindmayer Ser. No. 184,393 now Pat. No. 3,811,954, entitled "Fine Geometry Solar Cell," filed on Sept. 28, 1971 and assigned to the assignee herein.

The back electrode in state of the art cells typically covers the entire bottom surface of the semiconductor layer. This provides good conduction or collection of the photogenerated carriers. Since the solar energy impinges on the front surface it was believed suitable to have a back electrode covering the entire back surface.

In using deployed solar cell arrays, the problem of the cell equilibrium temperature becomes quite significant. Deployed solar cell arrays as opposed to body mounted solar cell arrays are held away from the body, e.g., satellite, and oriented toward the source of the solar radiation. The typical deployed solar cell array has very little thermal mass and is an advantage over body mounted arrays because the former are oriented at normal or near normal incidence to the sun. It has been discovered that the undesirable side-effect of this arrangement is a dramatic increase in the array operating temperature from 10° to 20°C, to 60°C or more, depending on factors such as the orbit of a satellite to which the array is attached. Since the power generated by solar cells decreases approximately 0.4 – 0.5 percent per °C in this range, the overall effect is to drop the available power substantially.

SUMMARY OF THE INVENTION

In accordance with the present invention, the problem of decreased power due to increased thermal temperature of solar arrays is alleviated by providing a cell having back electrodes which cover less than 10 percent of the back surface of the cell and preferably less than 5 percent of the back surface of the cell. Photolithographic techniques are used to place an electrode comprising extremely fine lines of metal separated by short distances onto the back surface. The electrode allows deep infrared to pass through the non-electroded surface areas and out into space. The amount of deep infrared absorbed by the electrode is substantially reduced and thus the thermal equilibrium temperature of the cells in a deployed array is not appreciably increased, when compared with prior art cells on the body mounted array.

The semiconductor material adjacent the bottom surface may be more heavily doped than the bulk of the bottom semiconductor layer to increase the lateral surface conductivity but this added feature is not necessary because the relatively large bulk of the bottom semiconductor layer is sufficient to provide good lateral conductivity.

At least the exposed areas of the bottom surface are covered with an insulating layer, e.g., $S_iO_x$, $T_iO_x$, which is optimized to achieve maximum emission of the deep infrared toward space.

DETAILED DESCRIPTION OF THE INVENTION

Figure 1:
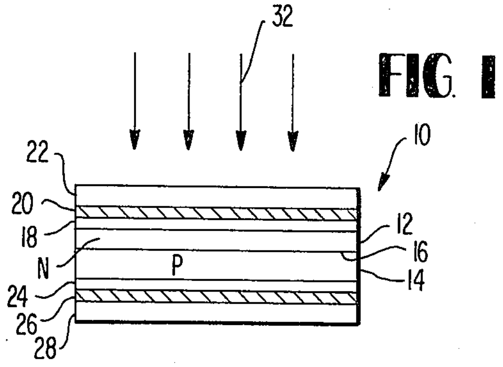
FIG. 1 is an exaggerated side view of a solar cell showing the relationship of the various layers of the cell.

As illustrated generally in FIG. 1, a solar cell 10 is illustrated having semiconductor layers 12 and 14 which may be silicon or other semiconductor material. The semiconductor material is doped in a well known manner to provide an n-type layer 12 and a p-type layer 14, which together define a p-n junction 16. The upper surface of the n-type layer 12 is exposed to light 32 which enters the semiconductor body through various other layers to the described.

The other layers on the top surface are the top electrode 18, an oxide coating 20 and a cover slide 22. The top electrode does not completely cover the top surface of the semiconductor but is formed in a pattern to allow much of the semiconductor surface to be exposed to the light. The oxide coating may or may not be directly over the metal pattern of the electrode but is over the exposed areas of the semiconductor. The cover slide 22 protects the cell against harmful radiation. The covering layers are chosen in a well known manner to maximize the transmission therethrough of light wavelength in the useful range and to maximize the reflection of light wave lengths in the non-useful range. The upper portion of the cell, just described, is not a novel feature of the present invention.

Figure 3:
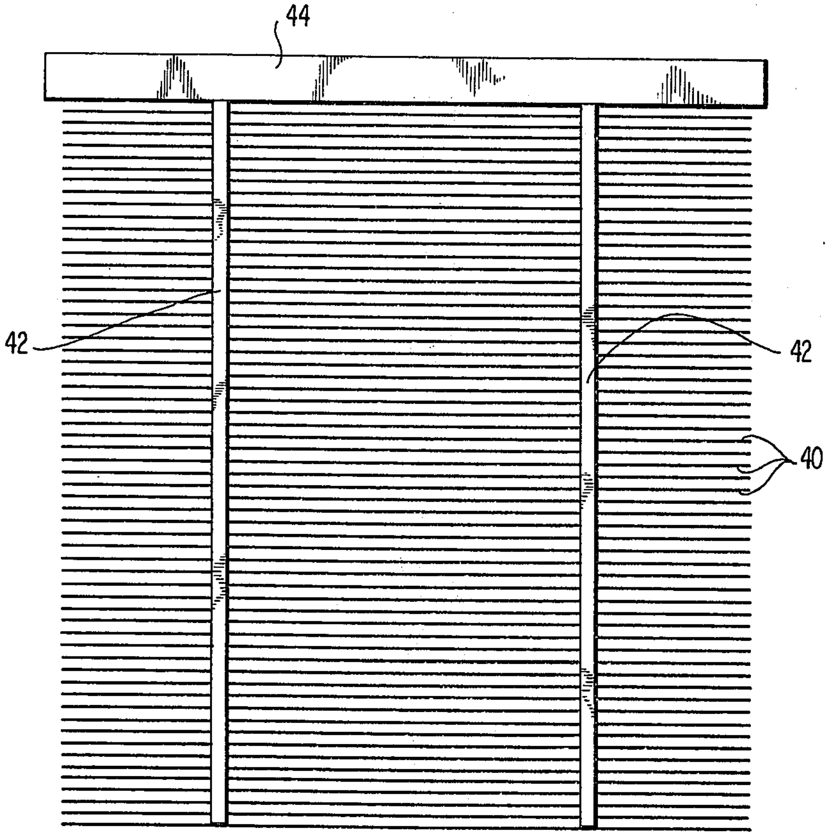
FIGS. 3 and 4 are examples of preferred embodiments of the pattern of the back electrode.
Figure 4:
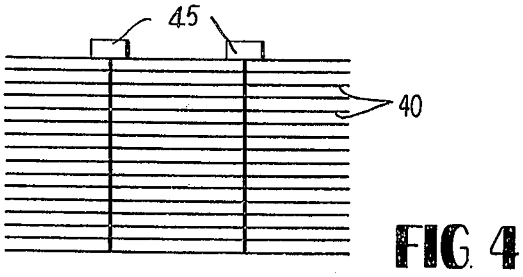

On the bottom surface there is provided an electrode 24. In conventional devices the latter electrode completely covers the back side and absorbs the deep infrared light which passes through the semiconductor layers. In accordance with the present invention the back electrode has a pattern of very fine lines which, on the one hand leaves most of the back surface uncovered by metal, and on the other hand provides metal extremely close to every point on the surface. This can be accomplished by laying down an electrode having a pattern such as shown in FIGS. 3 or 4. As an example, for a cell having a square back surface area of 2 cm. by 2 cm., a metallic electrode having a pattern such as is shown in FIGS. 3 or 4 may comprise 60 metallic lines, each being only 1 to 20 microns in width and extending substantially entirely across the back surface, separated 0.016 centimeters apart. Two additional fine lines 42 are provided to connect the multiple fine lines to a larger metallic region 44. The latter region is included to enable easy connection of the bottom electrode to external circuits. The large region 44 shown in FIG. 3 may be dispensed with and two smaller regions 45, as shown in FIG. 4, may be a part of the pattern. The pattern of FIG. 4 will allow an even larger portion of the back surface to be uncovered by metal but will be sufficient for connecting the electrode to external circuitry.

Electrode patterns of the type described can be placed on the back surface to leave 90 to 97 percent of the back surface uncovered by the electrode. In order to maximize the emission into space of the deep infrared wavelengths reaching the back surface, it is necessary to improve the optical matching characteristics at the interfaces. Semiconductors have a relatively high index of refraction, e.g., the index of refraction of silicon is about 4.0, whereas the index of refraction of space is 1.0. Generally, the greater the difference in indeces of refraction of two mediums forming an interface, the greater will be the percentage of incident light that is reflected. When the difference in indeces of refraction is relatively large, as it would be at an interface between silicon and space, the system is said to have poor optical matching characteristics.

In accordance with the present invention, the optical matching characteristics are improved by including at least one additional layer between the semiconductor and space which has an index of refraction between that for the semiconductor and space. The additional layer or layers also serve other important functions. Referring again to FIG. 1, at least the exposed areas of the back surface are covered by an oxide insulating coating 26 which preferably has an index of refraction between 2.0 and 2.5. One such suitable oxide coating is $T_iO_x$, which has an index of refraction of about 2.4. The latter coating improves the optical match and thereby increases the percentage of deep infrared which is emitted into space. The coating also provides the necessary insulating function for the semiconductor.

Additionally, in space applications, it is desirable to protect the cell from radiation damage. This can be accommplished by placing a conventional quartz cover slide 28 on the oxide layer 26. The quartz cover slide further improves the optical matching characteristics because it has an index of refraction of 1.46, which is between that of $T_iO_x$ and space. The quartz cover slide could be dispensed with if the oxide coating is made thick enough to protect the cell from radiation damage. However, difficult technological problems are presently encountered in attempting to make suitable oxide layers thick enough to protect againt radiation damage.

The novel device described may be fabricated by using conventional techniques. An example is to place a photoresist on the bottom surface and expose the photoresist to light through a mask which is a negative of the pattern shown in FIGS. 3 and 4. The exposed portions of the photoresist are removed to expose a semiconductor surface area having the same pattern as shown in FIGS. 3 and 4. A layer of metal is deposited onto the exposed surface/photoresist and adheres to the semiconductor surface. The remaining photoresist is removed in a conventional manner thereby also removing those portions of the metal layer overlying the photoresist. The remaining metal is the back electrode and has the form shown in FIGS. 3 and 4. The metal may be a combination of aluminum and silver. The oxide is then deposited onto the back surface having the patterned electrode thereon. A cover slide cut from a thin sheet of quartz may then be placed over the oxide.

As an alternative, the oxide may be deposited or grown first followed by etching the desired metal pattern in the oxide, and using known techniques for placing the metal on the surface regions exposed by etching away the oxide. In this case, the relation between the oxide 26 and the metal 24 will be as illustrated in FIG. 2.

Figure 2:
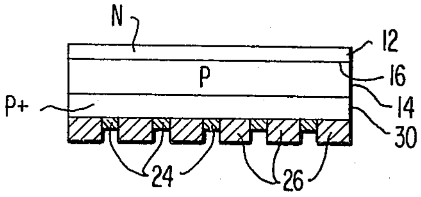
FIG. 2 is an exaggerated side view of part of the solar cell showing the relationship between the back electrode thin metallic lines and the oxide coating.

As a further alternative, the p-type layer 14, as shown in FIG. 2, may be heavily doped near the bottom surface to create a p+ layer 30 to improve the lateral conductivity near the surface. Although the layer 30 is shown in FIG. 2, it should be apparent that the p+ layer may be created whether the oxide is deposited before or after the metal.

What is claimed is:

1. A solar cell of the type comprised of at least two layers of semiconductor material of opposite type conductivity defining a p-n junction, the surface of one layer opposite said p-n junction being substantially closer to said p-n junction that the surface of said other layer opposite said p-n junction, the said surface of said one layer being the upper surface of said solar cell and being adapted to receive incident light, the said surface of said other layer being the bottom surface of said solar cell, said upper surface having an electrode configuration thereon through which light can pass to said top surface and into said semiconductor layers, the improvement comprising an electrode on said bottom surface formed in a pattern over said surface covering less than 10 percent of said bottom surface, and a layer of material covering at least those portions of said bottom surface not covered by said electrode, said latter mentioned layer of material being an electrical insulator and having an optical index of refraction intermediate that of the optical indeces of refraction for said semiconductor material and space wherein said electrode on said bottom surface pattern comprises a plurality of fine lines of metal interconnected by other metal lines terminating in larger metallic areas adapted for connecting said back electrode to external circuitry.

2. A solar cell as claimed in claim 1 wherein said plurality of fine lines are substantially parallel and extend across one dimension of said bottom surface, said lines being between 1 to 20 microns in width and having a separation of about 0.016 centimeters.

3. A solar cell as claimed in claim 2 wherein the electrode on said bottom surface is formed of aluminum and silver.

4. A solar cell as claimed in claim 3 wherein the said layer of semiconductor material which defines said bottom surface has a region adjacent said bottom surface which has a higher conductivity than the remainder of said semiconductor layer.

5. A solar cell as claimed in claim 4 wherein said solar cell further comprises a cover slide on said layer of insulating material, said cover slide being made of a material capable of protecting the cell from radiation damage and having an index of refraction between that of said insulator layer and space.

6. A solar cell as claimed in claim 5 wherein said cover slide is quartz.

7. A solar cell as claimed in claim 1 wherein the electrode on said bottom surface covers less than 5 percent of said bottom surface.

8. A solar cell as claimed in claim 1 wherein said electrical insulator is a material having an optical index of refraction between 2.0 and 2.5.

9. A solar cell as claimed in claim 3 wherein said electrical insulator is an oxide of titanium.

10. A solar cell as claimed in claim 9 wherein said semiconductor layers are silicon material.

11. A solar cell as claimed in claim 6 wherein said electrical insulator is a material having an optical index of refraction between 2.0 and 2.5.

12. A solar cell as claimed in claim 11 wherein said electrical insulator is an oxide of titanium.

13. A solar cell as claimed in claim 12 wherein said semiconductor layers are silicon material.

14. A solar cell as claimed in claim 13 wherein the electrode on said bottom surface covers less than 5 percent of said bottom surface.

* * * * *